(12) United States Patent  
Sakuyama et al.

(10) Patent No.: US 9,402,313 B2
(45) Date of Patent: Jul. 26, 2016

(54) CONDUCTIVE MATERIAL, CONDUCTIVE PASTE, CIRCUIT BOARD, AND SEMICONDUCTOR DEVICE

(71) Applicant: FUJITSU LIMITED, Kawasaki-shi, Kanagawa (JP)

(72) Inventors: Seiki Sakuyama, Kawasaki (JP); Taiji Sakai, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 273 days.

(21) Appl. No.: 14/163,031

(22) Filed: Jan. 24, 2014

(65) Prior Publication Data

US 2014/0140030 A1 May 22, 2014

Related U.S. Application Data

(60) Division of application No. 12/850,950, filed on Aug. 5, 2010, now Pat. No. 8,673,050, which is a continuation of application No. PCT/JP2008/054162, filed on Mar. 7, 2008.

(51) Int. Cl.
| | |
|---|---|
| H05K 7/10 | (2006.01) |
| H05K 1/11 | (2006.01) |
| H01B 1/02 | (2006.01) |
| H01B 1/22 | (2006.01) |
| H05K 3/46 | (2006.01) |

(52) U.S. Cl.
CPC ............... *H05K 1/115* (2013.01); *H01B 1/026* (2013.01); *H01B 1/22* (2013.01); *H05K 3/462* (2013.01); *H01L 2224/16225* (2013.01); *H05K 2201/0218* (2013.01); *H05K 2201/0272* (2013.01); *H05K 2201/10378* (2013.01); *H05K 2203/0425* (2013.01)

(58) Field of Classification Search
CPC ............... H01B 1/026; H01B 1/22; H01L 2224/16225; H05K 1/115; H05K 2201/0218; H05K 2201/0272; H05K 2201/10378; H05K 2203/0425; H05K 3/462
USPC ............... 361/783, 760; 75/255; 174/254–260
See application file for complete search history.

(56) References Cited

U.S. PATENT DOCUMENTS

| 4,147,669 A | 4/1979 | Shaheen et al. |
| 6,270,363 B1 | 8/2001 | Brofman et al. |
| (Continued) | | |

FOREIGN PATENT DOCUMENTS

| EP | 0708582 | * 4/1996 |
| EP | 0708582 A1 | 4/1996 |
| (Continued) | | |

OTHER PUBLICATIONS

International Search Report of PCT/JP2008/054162, Mailing Date of Dec. 16, 2008.

*Primary Examiner* — Yuriy Semenenko
(74) *Attorney, Agent, or Firm* — Westerman, Hattori, Daniels & Adrian, LLP

(57) ABSTRACT

A conductive material includes a first metal part whose main ingredient is a first metal; a second metal part formed on the first metal part and whose main ingredient is a second metal, the second metal having a melting point lower than a melting point of the first metal, which second metal can form a metallic compound with the first metal; and a third metal part whose main ingredient is a third metal, which third metal can make a eutectic reaction with the second metal.

6 Claims, 4 Drawing Sheets

(56) References Cited

U.S. PATENT DOCUMENTS

| | | | |
|---|---|---|---|
| 7,025,906 B2 | 4/2006 | Shimizu et al. | |
| 7,214,419 B2 | 5/2007 | Umeda et al. | |
| 7,531,115 B2 | 5/2009 | Watanabe et al. | |
| 7,785,500 B2 | 8/2010 | Yamaguchi et al. | |
| 2001/0038905 A1* | 11/2001 | Takada | H01L 23/49816 428/209 |
| 2002/0175316 A1* | 11/2002 | Shimizu | H01B 1/02 252/500 |
| 2004/0007384 A1* | 1/2004 | Soga | H05K 3/3484 174/260 |
| 2005/0230667 A1 | 10/2005 | Komagata et al. | |
| 2006/0289203 A1* | 12/2006 | Oda | H01L 21/486 174/264 |
| 2007/0245852 A1 | 10/2007 | Takaoka et al. | |
| 2008/0160309 A1* | 7/2008 | Kubota | C09C 1/62 428/403 |

FOREIGN PATENT DOCUMENTS

| | | |
|---|---|---|
| JP | 2-046603 A | 2/1990 |
| JP | 8-227613 A | 9/1996 |
| JP | 10-126022 A | 5/1998 |
| JP | 2002-194464 A | 7/2002 |
| JP | 2005-005630 A | 1/2005 |
| JP | 2005-302845 A | 10/2005 |
| JP | 2006-019306 A | 1/2006 |
| JP | 2007-081141 A | 3/2007 |
| WO | 2004/022663 A1 | 3/2004 |
| WO | 2006/085481 A1 | 8/2006 |

\* cited by examiner

FIG.3
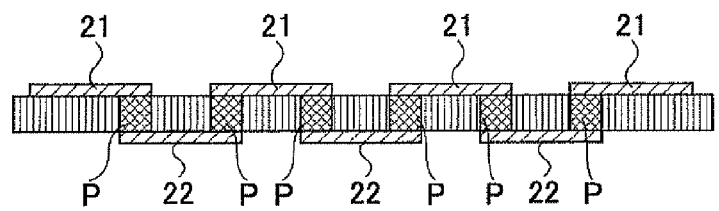
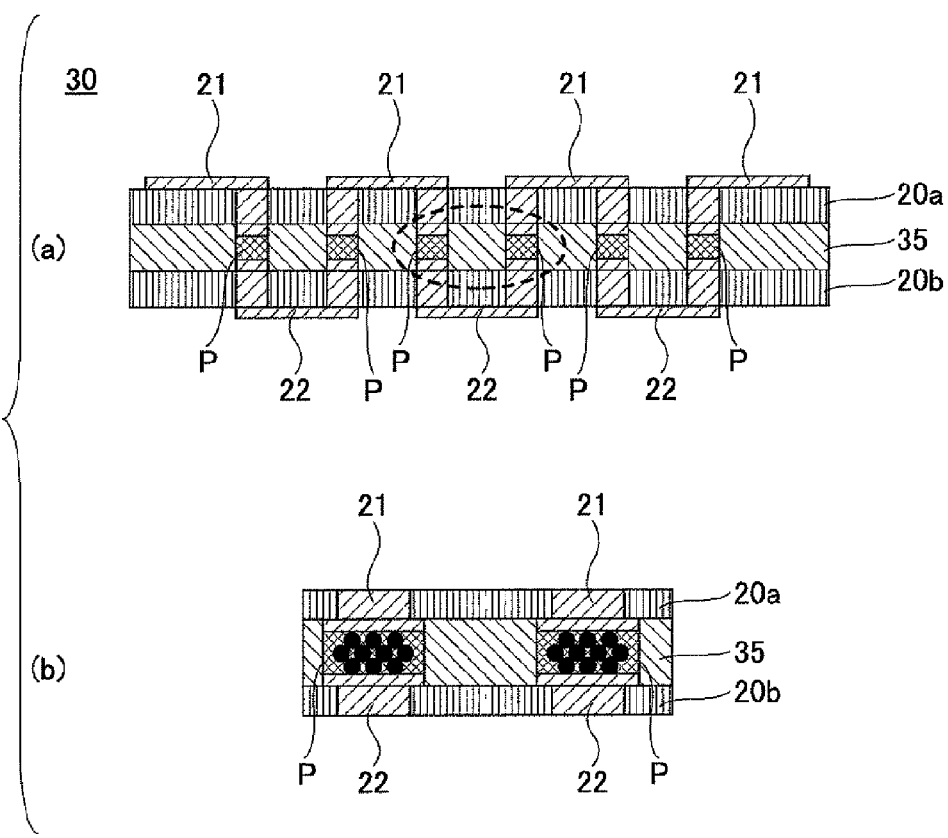
FIG.4

CONDUCTIVE MATERIAL, CONDUCTIVE PASTE, CIRCUIT BOARD, AND SEMICONDUCTOR DEVICE

CROSS-REFERENCE TO RELATED APPLICATION

This application is a divisional of U.S. application Ser. No. 12/850,950 filed Aug. 5, 2010, which is a U.S. continuation application filed under 35 USC 111(a) claiming benefit under 35 USC 120 and 365(c) of PCT application JP2008/054162, filed Mar. 7, 2008. The foregoing application is hereby incorporated herein by reference.

FIELD

The embodiments discussed herein are related to conductive materials, conductive pastes, circuit boards, and semiconductor devices.

BACKGROUND

It is required that a conductive material used for forming a conductive circuit on a circuit board such as a printed wiring board or an interlayer connecting between layers be chemically stable and have a low electric resistance. On the other hand, the circuit board such as the printed wiring board where an electronic component is mounted is required to have a structure where conductive circuits are formed with high densities in a multi-layer manner. Accordingly, in recent years, a printed wiring board where IVHs (Inner Via Holes) or blind via holes are formed with high density has been used. The IVHs or the blind via holes are formed by embedding the conductive materials in through holes or via holes so that upper and lower layers are connected to each other. With this structure, it is possible to achieve high density mounting of the electronic components.

As a method forming a conductive circuit on such a circuit board, a subtractive method has been used. In the subtractive method, a metal film as a conductive circuit is formed on an entire surface of the printed wiring board and then unnecessary metal film is etched by using a photolithography technique so that the conductive circuit is formed on the circuit board. In addition, as another method of forming the conductive circuit on the circuit board, the following method has been suggested for reducing the manufacturing cost. That is, a conductive paste film including particles of a conductive material such as silver (Ag), copper (Cu) or carbon (C) and a binder dissolved by a solvent is printed on the surface of the circuit board by a screen printing method so that a circuit is formed.

In addition, the following method is also suggested. That is, the IVH or the blind via hole is filled with a conductive paste and a curing process is applied so that a conductive circuit connects the interlayer of the circuit board.

Furthermore, a conductive material including plural particles having an electrically conductive coating, where some of the particles are fused to each other by the electrically conductive coating, has been suggested. See Japanese Laid-open Patent Application Publication No. 8-227613.

In addition, the following method has been suggested. That is, a conductive filler, where a film of tin (Sn) having a thickness of 1 μm is formed on surfaces of copper (Cu) particles by an electroless plating method, and a designated agent are mixed so that a conductive paste is formed. The conductive paste is printed by a screen printing method so that a conductive circuit and via plugs are formed. See Japanese Laid-open Patent Application Publication No. 2006-19306.

Furthermore, a conductive metal paste used for a terminal electrode of a monolithic ceramic electronic component has been suggested. See Japanese Laid-open Patent Application Publication No. 2-46603. In this conductive metal paste, an alloy formed of two kinds of metallic elements whose melting point is lower than the melting points of the elements, and an intermetallic compound formed of the two kinds of the metallic elements having high melting points, are used. In this suggestion, a compound metal powder where zinc (Zn) is coated on a surface of a copper (Cu) powder is used as a terminal electrode of the monolithic ceramic electronic component. By sintering at 500° C. through 600° C., diffusion progresses between the zinc (Zn) and the copper (Cu) so that part of the powder becomes brass and a high density sintered body is obtained. In addition, the remaining copper (Cu) is surrounded by the brass so that oxidization of an electrode surface of the copper (Cu) terminal is prevented.

SUMMARY

According to an aspect of the embodiments, includes a conductive material including a first metal part whose main ingredient is a first metal; a second metal part formed on the first metal part and whose main ingredient is a second metal, the second metal having a melting point lower than a melting point of the first metal, which second metal can form a metallic compound with the first metal; and a third metal part whose main ingredient is a third metal, which third metal can make a eutectic reaction with the second metal.

Additional objects and advantages of the embodiments will be set forth in part in the description which follows, and in part will be obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF DRAWINGS

FIG. 3 is a view for explaining a second embodiment;

FIG. 4 is a view for explaining a third embodiment;

DESCRIPTION OF EMBODIMENTS

Figure 1:
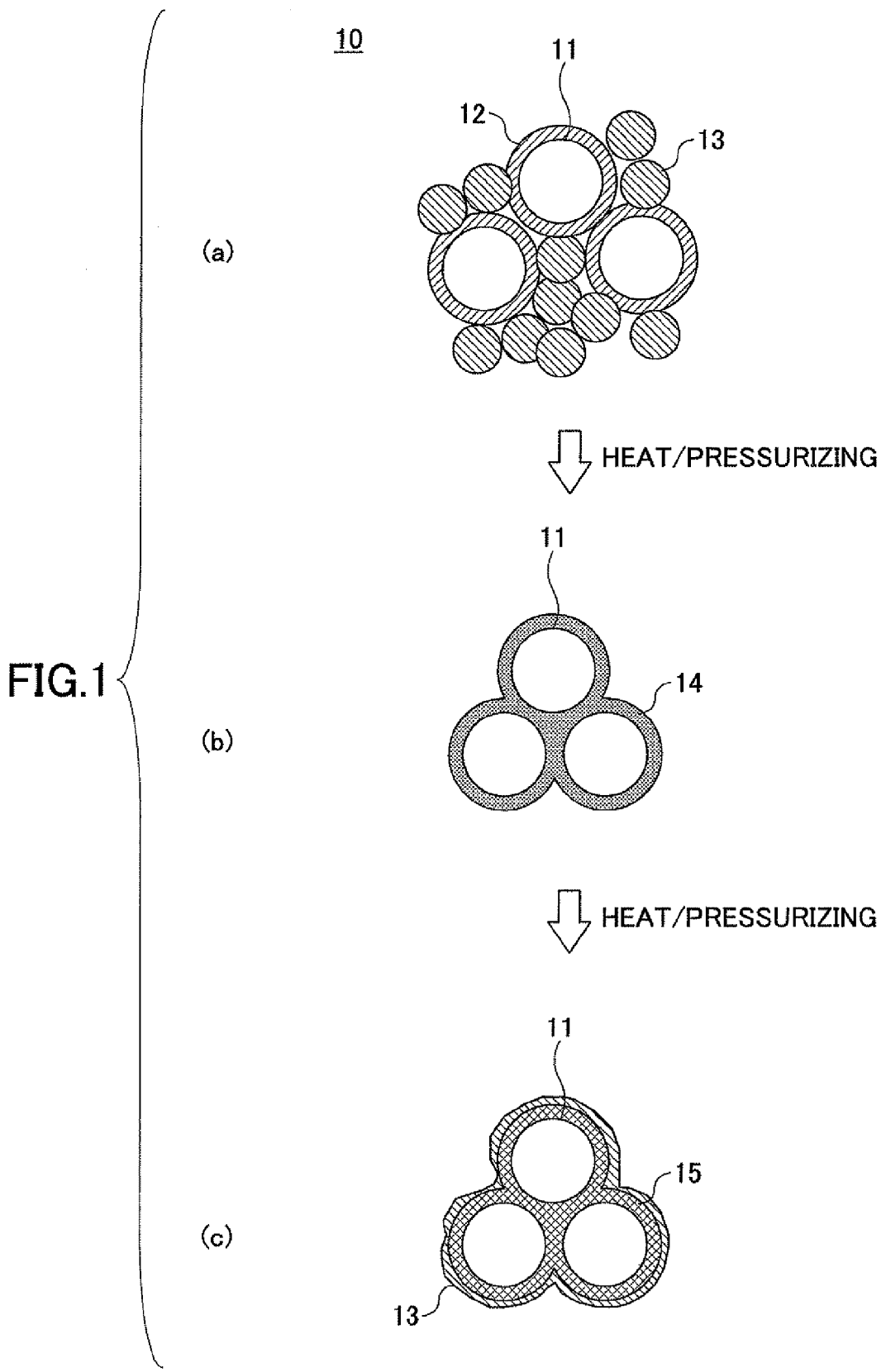
FIG. 1 is a view for explaining embodiments.

However, in the above-discussed method where the conductive circuit is formed by the screen printing, in a case where the conductive material used for the conductive paste is made of silver (Ag), while silver (Ag) has an electric resistance value of $5.0 \times 10^{-5}$ [Ω·cm] and good conductivity, silver may react with sulfur (S) so that silver sulfide is formed or migration may be generated. In a case where the conductive material used for the conductive paste is made of copper (Cu), copper (Cu) has an electric resistance value of $2.5 \times 10^{-4}$ [Ω·cm] and the conductivity of copper (Cu) is lower than that of silver (Ag). In a case where the conductive material used for the conductive paste is made of carbon (C), while carbon does not react with sulfur (S) so that sulfurization does not occur and migration is not generated, the conductive material has an electric resistance value of $3.0\times10^{-2}$ [Ω·cm] and the conductivity of carbon (C) is lower than that of copper (Cu).

In a case where a tin (Sn) group solder not including lead (Pb) is used as a connecting material for connecting the interlayer of the circuit board, the interlayer is connected at a temperature of 240° C. through 260° C. which is higher than 221° C. being a melting point of a tin (Sn)-silver (Ag) alloy (217° C. being a melting point of a tin (Sn)-3 silver (Ag)-0.5 copper (Cu) alloy). There is almost no connecting material whose main ingredient is tin (Sn) and whose melting point is equal to or greater than 260° C. being a heat-resistant temperature of the circuit board. Therefore, for example, a material whose main ingredient is gold (Au) should be selected as the connecting material for connecting the interlayer of the circuit board.

However, an alloy group whose main ingredient is gold (Au) has a high melting point. For example, a melting point of a gold (Au)-tin (Sn) alloy is 280° C. A melting point of a gold (Au)-tin (Sn) alloy is 280° C. A melting point of a gold (Au)-germanium (Ge) alloy is 356° C. A melting point of a gold (Au)-silicon (Si) alloy is 370° C. Therefore, in a case where these materials are used as the connecting material for connecting the interlayer of the circuit board, thermal damage applied to other members forming the circuit may become large. In addition, since gold (Au) is a main ingredient of these materials, there may be a problem of material cost. Furthermore, a material of an alloy group whose main ingredient is gold (Au), compared to a lead (Pb)-tin (Sn) group solder material, is solid and fragile, so there may be a problem in terms of connecting reliability.

In addition, due to heat applied when the electronic component is connected to the circuit board and difference of coefficients of thermal expansion between the electronic component and the circuit board, a position shift of a minute connecting part of the electronic component may be a serious problem for connectability. Accordingly, it is preferable that the heating temperature at the time of connecting be lower. For example, in a case of an organic circuit board having a high coefficient of thermal expansion, it is necessary to make the heating temperature be equal to or lower than 160° C. On the other hand, in a case where the connecting temperature is low, if the connecting part is remelted by other processes, reliability may be degraded. Therefore, it is necessary for a structure of the connecting part of the final product to bear the high temperature.

As a means for solving this problem, a nano paste material using nano size particles has been recently developed. However, in the case of the nano paste material, while the nano paste material may be easily sintered (cohesive coupled) at a low temperature, the manufacturing cost of the nano size particles is high because a manufacturing method of the nano-size particles is specific.

Preferred embodiments of the present disclosure will be explained with reference to accompanying drawings.

FIGS. 1(a)-1(c) are views for explaining embodiments.

As shown in FIG. 1(a), in a conductive material 10 of the embodiments, a second metal part 12 is formed on a surface of a first metal part 11 as a core. The first metal part 11 is a particle of metal or alloy whose main ingredient is a first metal. The second metal part 12 is an alloy film whose main ingredient is a second metal. The second metal has a melting point lower than the melting point of the first metal. The second metal and the first metal can form an intermetallic compound. In addition, a third metal part 13 is mixed in the conductive material 10. The third metal part 13 is made of a powder of an alloy or a metal whose main ingredient is a third metal. The third metal can undergo a eutectic reaction with the second metal.

As the first metal forming the first metal part 11, for example, copper (Cu) or an alloy of copper (Cu) such as a powder of brass or phosphor copper can be used.

As the second metal forming the second metal part 12, tin (Sn) or an alloy of tin (Sn) whose main ingredient is tin (Sn), such as tin (Sn)-silver (Ag), tin (Sn)-zinc (Zn), tin (Sn)-indium (In), tin (Sn)-antimony (Sb), or tin (Sn)-bismuth (Bi), can be used.

As the third metal forming the third metal part 13, a powder of bismuth (Bi), indium (In), or bismuth (Bi)-silver (Ag) or bismuth (Bi)-copper (Cu) whose main ingredient is bismuth (Bi) can be used.

Since the conductive material 10 can be used for forming a minute circuit, embedding in vias, connecting an electronic component, or the like, a grain size of the powder may be equal to or less than approximately 10 μm. Because of this, an electroless plating method may be used for forming a film of the second metal forming the second metal part 12 on the surface of the first metal forming the first metal part 11. It is general practice that a barrel plating method using electroplating is used as a method for plating metal powder. However, in a case of a process for an impalpable powder using the barrel plating method, the yield rate may be decreased and it may be difficult to control a film thickness of plating. Accordingly, the electroless plating method for a material having the above-mentioned problem may be used.

A plating thickness of the film of the second metal by the electroless plating method can be properly set by the grain size of the powder of the first metal, the grain size of the powder of the third metal, a compounding ratio, and others. From the view point of adhesion at a low temperature and high melting point, in order to make a diffusion process progress, the plating thickness of the film of the second metal may be approximately 1 μm through approximately 3 μm.

The compounding ratio of the powder of the first metal of the first metal part 11 having the surface on which the second metal part 12 is formed and the powder of the third metal forming the third metal part 13 can be properly changed based on use. However, from the view point of adhesion at a low temperature and high melting point, in order to make a diffusion process progress, the compounding ratio of the powder of the third metal may be approximately 20% through approximately 60%.

In order to make the conductive material be in a paste state, from the view point of supplying the paste by printing, a ratio of the powder may be approximately 70 wt % through approximately 95 wt %. In a case where the paste is supplied by using other methods such as a dispensing method or an ink jet method, the ratio of the powder may be equal to or less than approximately 70 wt %.

When a heating process and a pressurization process are applied so that the temperature of the conductive material reaches a temperature equal to or lower than a heat resistant temperature of an insulation substrate used as the circuit board and equal to or lower than a glass transition temperature of the substrate (for example, equal to or lower than approximately 160° C.), an eutectic reaction of the second metal forming the second metal part 12 and the third metal forming then third metal part 13 is generated. As a result of this, as illustrated in FIG. 1(b), a metallic compound 14 of the second metal and the third metal is formed around the first metal part 11.

When a heating process and a pressurization process are applied, as illustrated in FIG. 1(c), the first metal of the first metal part 11 and the second metal in the metallic compound 14 react with each other so that a metallic compound 15 of the first metal and the second metal and the third metal part 13 having melting points higher than the heat resistant temperature of the insulation substrate used as the circuit board (for example, a temperature equal to or higher than 260° C.) are formed. The third metal part 13, as well as the metallic compound 15, also has a melting point higher than the heat resistant temperature of the insulation substrate used as the circuit board (for example, a temperature equal to or higher than 260° C.). Accordingly, the conductive material shown in FIG. 1(c) has an increased melting point and therefore is not melted at a temperature higher than the heat resistant temperature of the insulation substrate used as the circuit board (for example, a temperature equal to or higher than 260° C.).

A circuit part including the above-mentioned conductive material is thermally stable. The conductive material is not remelted at approximately 220° C. through approximately 240° C. which is a reflow soldering temperature in a case where the electronic component is mounted on the circuit board.

Such a conductive material can be used as a conductive paste where resin component is mixed. A resin component, where any of an epoxy group, a phenol group and a silicon group is used as a base and an organic acid or the like is added, can eliminate or prevent oxidization of the conductive material, so as to form a good-bonding metallic body. For example, a conductive paste as a connecting material, like a solder paste, can be formed by mixing the conductive material, rosin resin, an organic acid or a halogen group active ingredient, and a solvent.

In addition, the metallic compound 15 of the first metal and the second metal has an electric resistance value so that the metallic compound 15 can be used as a conductive circuit of the circuit board. Hence, it is possible to mount the electronic component on the circuit board including the conductive circuit formed by the conductive material or the conductive paste of the embodiments.

The above-mentioned conductive material and conductive paste can be used as a connecting member of the electronic component such as a semiconductor element, since the above-discussed conductive material and conductive paste can be used in substitution for solder including lead (Pb) having a high melting point. Hence, it is possible to connect the electronic component such as the Semiconductor Element to the Board at a Low temperature where there is little influence of the difference in coefficients of thermal expansion and then to form the connecting part with high reliance where the melting point is increased.

[a] First Embodiment

Next, a first embodiment is discussed.

The inventors prepared seven kinds of conductive materials A through G mentioned in a TABLE 1. More specifically, a copper (Cu) powder having grain size of approximately 5 μm through approximately 10 μm was used as the first metal forming the first metal part 11 illustrated in FIG. 1. Conductive particles where a film having thickness of approximately 2 μm and made of electroless tin (Sn) plating, electroless tin (Sn)-silver (Ag) plating, or electroless tin (Sn)-indium (In) plating was formed on the surface of the first metal as the second metal forming the second metal part 12, and a bismuth (Bi) powder, a bismuth (Bi)-silver (Ag) powder, or a bismuth (Bi)-copper (Cu) powder as the third metal forming the third metal part 13 were mixed. Thereby seven kinds of the conductive materials A through G were formed.

A mixture ratio of the third metal forming the third metal part 13 to the first metal forming the first metal part 11 having the surface where the second metal part 12 was formed could be properly selected in a range of approximately 20% through approximately 60% in order to achieve low temperature connecting and increase of the melting point. The mixture ratio of each of the conductive materials A through G is indicated in the following TABLE 1.

TABLE 1

| Conductive Material | $1^{st}$ Metal | $2^{nd}$ Metal | $3^{rd}$ Metal | Mixing Ratio of $3^{rd}$ Metal |
|---|---|---|---|---|
| A | Cu Powder | Electroless Sn | Bi Powder | 50% |
| B | Cu Powder | Electroless SnAg | Bi Powder | 50% |
| C | Cu Powder | Electroless Sn | BiAg Powder | 60% |
| D | Cu Powder | Electroless SnAg | BiAg Powder | 60% |
| E | Cu Powder | Electroless Sn | BiCu Powder | 40% |
| F | Cu Powder | Electroless SnAg | BiCu Powder | 40% |
| G | Cu Powder | Electroless SnIn | Bi Powder | 50% |

In addition, by mixing each of the above-mentioned conductive materials A through G and a resin ingredient where bisphenol F type epoxy resin, a curing agent, and adipic acid are mixed were mixed at 6:4, seven kinds of conductive pastes 1 through 7 were made. To each of the conductive pastes 1 through 7, a heating process at approximately 100° C. through approximately 290° C. was applied twice.

Figure 2:
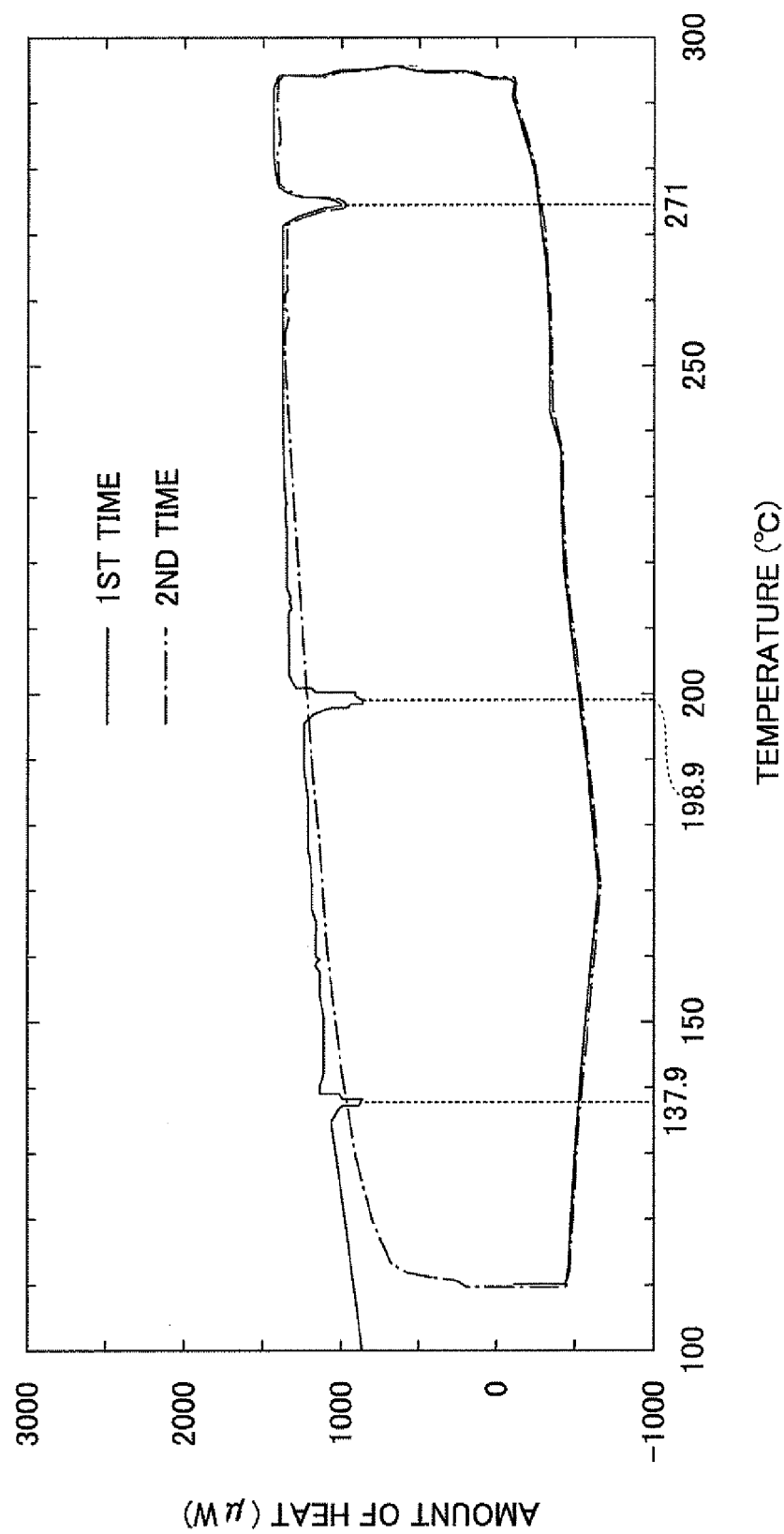
FIG. 2 is a graph of temperature change and a measuring result of a heating amount by performing heating processes two times.

FIG. 2 is a graph of temperature change and a measuring result of a heating amount (heating rate) by two heating processes.

In the graph indicated in FIG. 2, the vertical axis represents the heating amount [μW] and the horizontal axis represents temperature [° C.]. In addition, a solid line indicates temperature change and a measuring result of the heating amount by the first time heating process. A one-dotted line indicates temperature change and a measuring result of the heating amount by the second time heating process.

As illustrated in FIG. 2, it is found that, in any of the conductive pastes 1 through 7, by the first time heating process, at 137.9° C., a eutectic reaction between the second metal and the third metal is generated so that a metallic compound of the second metal and the third metal is formed. It is also found that, at 198.9° C., the first metal and the second metal forming the metallic compound of the second metal and the third metal reacted with each other. By applying the second time heating process after the first time heating process was completed, the eutectic reaction of the second metal and the third metal was not generated at 137.9° C. It was found that the heating amount is reduced when the temperature reached 271° C.

This phenomenon indicates that the melting points of the conductive pastes 1 through 7 are increased so as to reach a temperature higher than the heat resistant temperature of the insulation substrate used as the circuit board (for example, a temperature equal to or higher than 260° C.).

The inventors confirmed the status of the conductive paste after the heating process. It was found that each of the conductive pastes 1 through 7 is changed to a structure where the first metal part made of copper (Cu), the metallic compound of copper (Cu) and tin (Sn) formed on the surface of the first metal part, and bismuth (Bi) formed on an upper surface of the metallic compound are formed. In addition, the inventors measured electric resistance of each of the conductive pastes 1 through 7 after the heating process. It was found that the conductive pastes 1 through 7 had respective low resistances between $1.0 \times 10^{-6}$ Ω·cm and $2.0 \times 10^{-6}$ Ω·cm.

TABLE 2

| Paste | Resistance [Ω · cm] |
|---|---|
| 1 | $1.5 \times 10^{-6}$ |
| 2 | $1.0 \times 10^{-6}$ |
| 3 | $1.5 \times 10^{-6}$ |
| 4 | $1.5 \times 10^{-6}$ |
| 5 | $1.3 \times 10^{-6}$ |
| 6 | $1.0 \times 10^{-6}$ |
| 7 | $2.0 \times 10^{-6}$ |

The inventors also mixed the conductive materials A through G and a resin ingredient where rosin resin, acetic anhydride, and Butyl carbitol were mixed at 9:1, so that seven kinds of conductive pastes 8 through 14 were made. In addition, after a heating process at approximately 100° C. through approximately 290° C. is repeated twice for each of the conductive pastes 8 through 14, the electric resistance of each of the conductive pastes 8 through 14 was measured. As indicated in TABLE 3, the conductive pastes 8 through 14 have respective low resistances between $5.0 \times 10^{-6}$ Ω·cm and $6.0 \times 10^{-6}$ Ω·cm.

TABLE 3

| Paste | Resistance [Ω · cm] |
|---|---|
| 8 | $5.0 \times 10^{-6}$ |
| 9 | $5.0 \times 10^{-6}$ |
| 10 | $5.2 \times 10^{-6}$ |
| 11 | $5.5 \times 10^{-6}$ |
| 12 | $5.3 \times 10^{-6}$ |
| 13 | $5.0 \times 10^{-6}$ |
| 14 | $6.0 \times 10^{-6}$ |

[b] Second Embodiment

The inventors, as illustrated in FIG. 3, supplied the above-discussed conductive pastes 1 through 7 (indicated by "P" in FIG. 3) in via holes formed in the wiring board (circuit board) 20. A base material of the wiring board (circuit board) 20 is insulation resin such as glass epoxy resin. Conductive patterns (wiring parts) 21 and 22 made of copper (Cu) or the like are selectively provided on upper and lower surfaces of the wiring board (circuit board) 20.

The via hole can be formed by a drilling process, laser processing, or the like and has, for example, a diameter of approximately 100 μm. Any of the above-mentioned conductive pastes 1 through 7 can be supplied in the via holes by, for example, screen printing or the like. Any of the cured conductive pastes 1 through 7 can electrically connect the conductive patterns 21 and 22 formed on upper and lower surfaces of the base material of the wiring board.

After applying the heating process at approximately 150° C. in a vacuum state to such a structure, the inventors confirmed, as well as the results provided in TABLE 2 and TABLE 3 of the first embodiment, the forming of a low resistance circuit. In addition, the remelting phenomenon where the conductive pastes 1 through 7 supplied in the via holes and cured was not observed even if heating at a temperature higher than the heat resistant temperature of the insulation substrate used as the circuit board (for example, a temperature equal to or higher than 260° C.) was applied. A conductive connection through a via hole structure having high reliability could be formed.

[c] Third Embodiment

FIGS. 4(a) and 4(b) are views for explaining a third embodiment. FIG. 4(b) is an expanded view of a portion surrounded by a dotted line in FIG. 4(a).

A multilayer wiring board 30 of this embodiment has a structure where a resin substrate 20a and a resin substrate 20b are stacked via an adhesive tape 35. A base material of the resin substrate 20a is an insulation resin such as glass epoxy resin. Conductive patterns (wiring parts) 21 made of copper (Cu) or the like are provided on an upper surface and inside of the resin substrate 20a. A base material of the resin substrate 20b is an insulation resin such as glass epoxy resin. Conductive patterns (wiring parts) 22 made of copper (Cu) or the like are provided on a lower surface and inside of the resin substrate 20b.

The inventors formed the multilayer wiring board 30 by the following method. Via holes are formed in positions of the adhesive sheet 35 corresponding to the conductive patterns 21 formed inside the resin substrate 20a and the conductive patterns 22 formed inside the resin substrate 20b. Any of the above-discussed conductive pastes 1 through 7 are supplied in the via holes. In FIG. 4, the conductive pastes 1 through 7 are indicated by the reference "P".

The via hole can be formed by a drilling process, a laser processing, or the like and has, for example, a diameter of approximately 100 μm. Any of the above-mentioned conductive pastes 1 through 7 can be supplied in the via holes by, for example, screen printing or the like. Any of the cured conductive pastes 1 through 7 may electrically connect the conductive patterns 21 and 22 formed inside the resin substrates 20a and 20b.

After applying the heating process at approximately 150° C. in a vacuum state to such a structure, the inventors confirmed, as well as the results provided in TABLE 2 and TABLE 3 of the first embodiment, the forming of low resistance circuits. In addition, the remelting phenomenon where the conductive pastes 1 through 7 supplied in the via holes and cured was not observed even if heating at a temperature higher than the heat resistant temperature of the insulation substrate used as the circuit board (for example, a temperature equal to or higher than 260° C.) was applied. A multi-layer wiring board including a conductive connection through a via hole structure having high reliability could be formed.

[d] Fourth Embodiment

Figure 5:
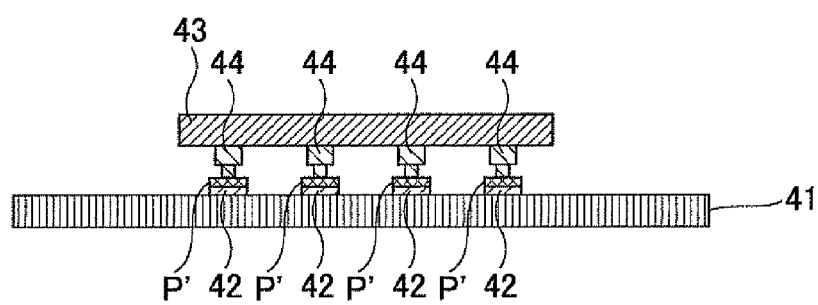
FIG. 5 is a view for explaining a fourth embodiment.

FIG. 5 is a view for explaining a semiconductor device 40 of a fourth embodiment.

In forming the semiconductor device 40, convex-shaped (projecting) outside connection terminals 44 formed on a main surface of a semiconductor element 43 are connected to electrode terminals 42 exposed on an upper surface of a wiring board (circuit board) 41. In other words, the semiconductor element 43 is mounted on the wiring board 41 in a so-called flip chip (face down) state. The wiring board 41 has a base member made of insulation resin such as glass epoxy resin manufactured by a built-up process. The electrode terminals 42 are made of copper (Cu). A base material of the semiconductor element 43 is silicon (Si) or the like.

More specifically, the convex-shaped (projecting) outside connection terminals 44 called bumps are formed, by gold (Au) plating, on electrode pads (not illustrated in FIG. 5) formed on, with approximately 80 μm pitches, a main surface of the semiconductor element 43 having a substantially square shaped configuration whose one side has a length of approximately 10 mm. Then, any of the conductive pastes 8 through 14 discussed with reference to TABLE 3 (illustrated by the reference "P"' in FIG. 5) are transferred to the electrode terminals 42 of the wiring board 41. After that, the convex-shaped outside connection terminals 44 and the electrode terminals 42 of the wiring board 41 are positioned and connected to each other and a heating process at approximately 150° C. is applied.

After that, an underfill agent is supplied by capillary reflow between the wiring board 41 and the semiconductor element 43 and a curing process at approximately 180° C. is applied for approximately one hour. As a result of this, a connection resistance at a connection portion where any of the conductive pastes 8 through 14 are used is approximately $5.0 \times 10^{-6}$ Ω·cm. Hence, it could be confirmed that the connection resistance of this embodiment, as well as that in the first embodiment, was low and a good connecting part was formed. It was also confirmed that this connecting part was not remelted at a temperature lower than the heat-resistant temperature of the wiring board 31 such as a temperature equal to or lower than approximately 260° C.

[e] Fifth Embodiment

Figure 6:
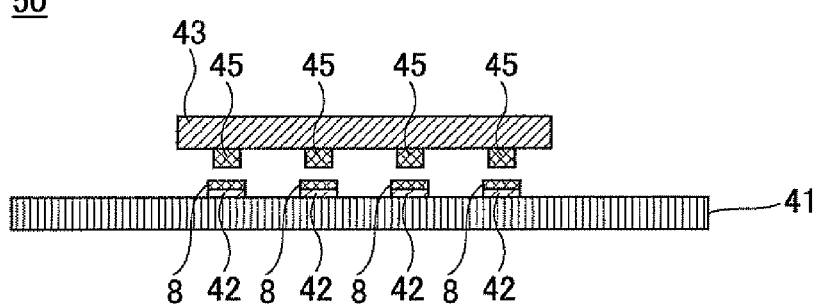
FIG. 6 is a view for explaining a fifth embodiment.

FIG. 6 is a view for explaining a semiconductor device 50 of a fifth embodiment.

In forming the semiconductor device 50, convex-shaped (projecting) outside connection terminals 45 formed on a main surface of a semiconductor element 43 are connected to electrode terminals 42 exposed on an upper surface of a wiring board (circuit board) 41. In other words, the semiconductor element 43 is mounted on the wiring board 41 in a so-called flip chip (face down) state. The wiring board 41 has a base member made of insulation resin such as glass epoxy resin manufactured by a built-up process. The electrode terminals 42 are made of copper (Cu). A base material of the semiconductor element 43 is silicon (Si) or the like.

More specifically, the conductive paste 8 discussed with reference to TABLE 3 is printed on the electrode terminals 42 formed on, with approximately 150 μm pitches, a main surface of the wiring board 41 having a substantially square shaped configuration whose one side has a length of approximately 10 mm. A heating process at approximately 150° C. was applied so that the convex-shaped (projecting) outside connection terminals 45 called bumps are formed. On the other hand, the conductive pastes 8 are printed on the electrode terminals 42 of the wiring board 41.

After that, the outside connection terminals 45 and the electrode terminals 42 of the wiring board 41 were positioned so as to be connected to each other and then a heating process at approximately 150° C. was applied.

Then, an underfill agent was supplied by capillary reflow between the wiring board 41 and the semiconductor element 43 and a curing process at approximately 180° C. was applied for approximately one hour. As a result of this, a connection resistance at a connection portion where the conductive paste 8 is used is approximately $5.0 \times 10^{-6}$ Ω·cm. Hence, it could be confirmed that the connection resistance of this embodiment, as well as that in the first embodiment, was low and a good connecting part was formed. It was also confirmed that this connecting part was not remelted at a temperature lower than the heat-resistant temperature of the wiring board 41 such as a temperature equal to or lower than approximately 260° C.

As discussed in the first through fifth embodiments, according to the conductive material of the embodiments, an electric connecting part is formed by the metallic compound and the third metal being the main ingredient of the third metal part. The metallic compound is formed by the first metal being the main ingredient of the first metal part and the second metal being the main ingredient of the second metal part.

According to the embodiments, it is possible to provide a conductive material having an electric resistance value lower than that of the related art conductive material, which conductive material can be melted and connected at a temperature equal to or lower than the heat-resistant temperature of the insulation substrate used as the circuit board. The conductive material has a melting point higher than the heat-resistant temperature of the insulation substrate due to the metallic reaction and can endure heat at a soldering temperature of the electronic component. In addition, it is possible to realize an electric connection having high reliability and sufficient strength.

In addition, the conductive material of the embodiments has a melting point higher than the heat-resistant temperature of the insulation substrate. Therefore, it is possible to form the circuit and connect the electronic component at a low temperature. Hence, it is possible to reduce the stress which may be generated in a manufacturing process of the circuit board and the semiconductor device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

The above-discussed embodiments can be applied to the conductive material and the conductive paste which is used for forming the conductive circuit in and on the circuit board and making interlayer connection between the circuits. The above-discussed embodiments can be applied to the circuit board and the semiconductor device using the conductive material or the conductive paste.

What is claimed is:
1. A circuit board, comprising:
a plurality of circuit parts;
a connecting part including conductive material, comprising:
a first metal part whose main ingredient is a first metal;
a second metal part formed on the first metal part and whose main ingredient is a second metal, the second metal having a melting point lower than a melting point of the first metal, which second metal forms a metallic compound with the first metal; and
a third metal part whose main ingredient is a third metal, which third metal makes a eutectic reaction with the second metal;
wherein the circuit parts are connected to each other by the connecting part,
the first metal is copper (Cu) or a copper (Cu) alloy, the second metal is tin (Sn) or a tin (Sn) alloy, and the third metal is a powder of bismuth (Bi), indium (In) or an alloy whose main ingredient is bismuth (Bi), the eutectic reaction of the second metal and the third metal is made at a temperature equal to or lower than a glass transition temperature of an insulation substrate, and the metallic compound is formed of the first metal and the second metal and a temperature of a melting point of the metallic compound is higher than a heat-resistant temperature of the insulation substrate.

2. The circuit board as claimed in claim 1, wherein the connecting part is formed of the metallic compound and the third metal, which metallic compound is formed by the first metal being the main ingredient of the first metal part and the second metal being the main ingredient of the second metal part, the third metal being the main ingredient of the third metal part.

3. The circuit board as claimed in claim 1, wherein the circuit board is a multi-layer wiring board where a plurality of resin substrates having the circuit parts is stacked.

4. A semiconductor device, comprising:

a semiconductor element; and a wiring board having a main surface where the semiconductor element is connected, wherein the wiring board is the circuit board as claimed in claim 1.

5. A semiconductor device, comprising:

a semiconductor element; and a wiring board having a main surface where the semiconductor element is connected, wherein the wiring board and the semiconductor element are connected to each other by a connecting part including a conductive material comprising a first metal part whose main ingredient is a first metal;

a second metal part formed on the first metal part and whose main ingredient is a second metal, the second metal having a melting point lower than a melting point of the first metal, which second metal forms a metallic compound with the first metal; and a third metal part whose main ingredient is a third metal, which third metal makes a eutectic reaction with the second metal, the first metal is copper (Cu) or a copper (Cu) alloy, the second metal is tin (Sn) or a tin (Sn) alloy, and the third metal is a powder of bismuth (Bi), indium (In) or an alloy whose main ingredient is bismuth (Bi), the eutectic reaction of the second metal and the third metal is made at a temperature equal to or lower than a glass transition temperature of an insulation substrate, and the metallic compound is formed of the first metal and the second metal and a temperature of a melting point of the metallic compound is higher than a heat-resistant temperature of the insulation substrate.

6. The semiconductor device as claimed in claim 5, wherein the connecting part is formed of the metallic compound and the third metal, which metallic compound is formed of the first metal being the main ingredient of the first metal part and the second metal being the main ingredient of the second metal part, the third metal being the main ingredient of the third metal part.

* * * * *